United States Patent [19]

Pistouley

[11] Patent Number: 5,170,051
[45] Date of Patent: Dec. 8, 1992

[54] ELASTIC GRIPPING OPTOELECTRONIC SENSOR FOR AN ENERGY CONSUMPTION METER

[75] Inventor: Christophe Pistouley, Bompas, France

[73] Assignee: Manufacture D'Appareillage Electrique De Cahors, Cahors, France

[21] Appl. No.: 635,577

[22] PCT Filed: Jun. 20, 1990

[86] PCT No.: PCT/FR90/00447
§ 371 Date: Jan. 23, 1991
§ 102(e) Date: Jan. 23, 1991

[87] PCT Pub. No.: WO90/15971
PCT Pub. Date: Dec. 27, 1990

[30] Foreign Application Priority Data

Jun. 21, 1989 [FR] France .................. 89 08268

[51] Int. Cl.$^5$ ............................... G01D 5/34
[52] U.S. Cl. ....................... 250/231.13; 340/870.02
[58] Field of Search ............ 250/231.13, 231.15, 250/237 G; 340/870.02; 341/13, 15

[56] References Cited

U.S. PATENT DOCUMENTS

| 4,031,441 | 6/1977 | Garrett | 250/231.13 |
| 4,037,219 | 7/1977 | Lewis | 250/231.15 |
| 4,638,314 | 1/1987 | Keller | 340/870.02 |
| 4,792,677 | 12/1988 | Edwards et al. | 250/231.13 |
| 4,803,484 | 2/1989 | Schutrum et al. | |
| 4,942,295 | 7/1990 | Brunner et al. | 250/231.13 |

FOREIGN PATENT DOCUMENTS

| 0003153 | 7/1979 | European Pat. Off. |
| 2614098 | 10/1988 | France |
| 2034882 | 6/1980 | United Kingdom |

Primary Examiner—David C. Nelms
Assistant Examiner—Que T. Le
Attorney, Agent, or Firm—Young & Thompson

[57] ABSTRACT

The optoelectronic sensor is intended to be placed in a domestic energy consumption meter which comprises a rotary member (2) whose rotational speed is a function of energy consumption. The sensor (1) is accommodated in a support (7) comprising a tongue (18) allowing it to be fastened by elastic gripping to an existing part (15) inside the meter, the tongue maintaining the sensor (1) at a fixed distance from the rotary member (2) of the motor. The invention is used especially in electricity consumption meters.

6 Claims, 5 Drawing Sheets

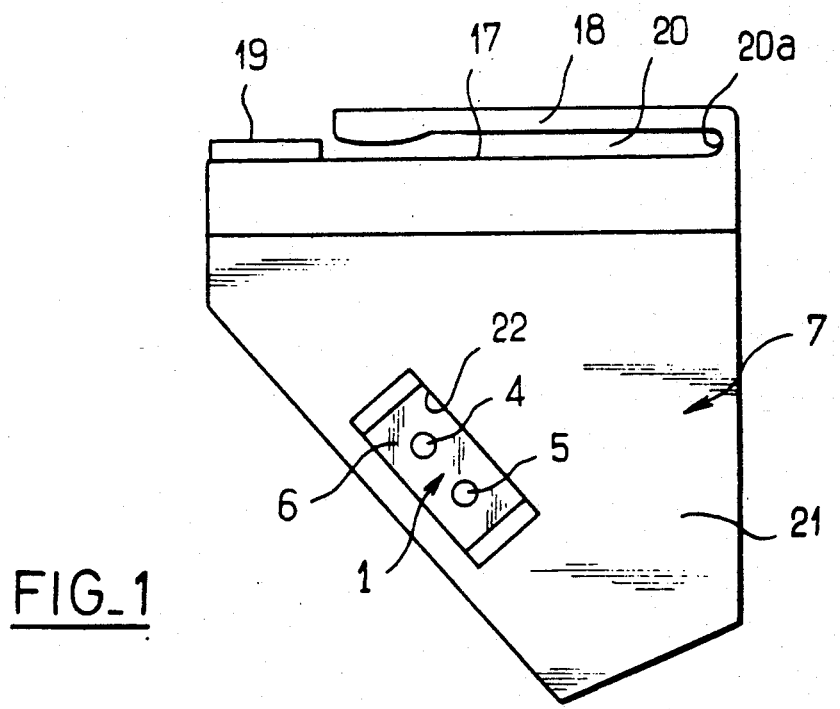
FIG_1
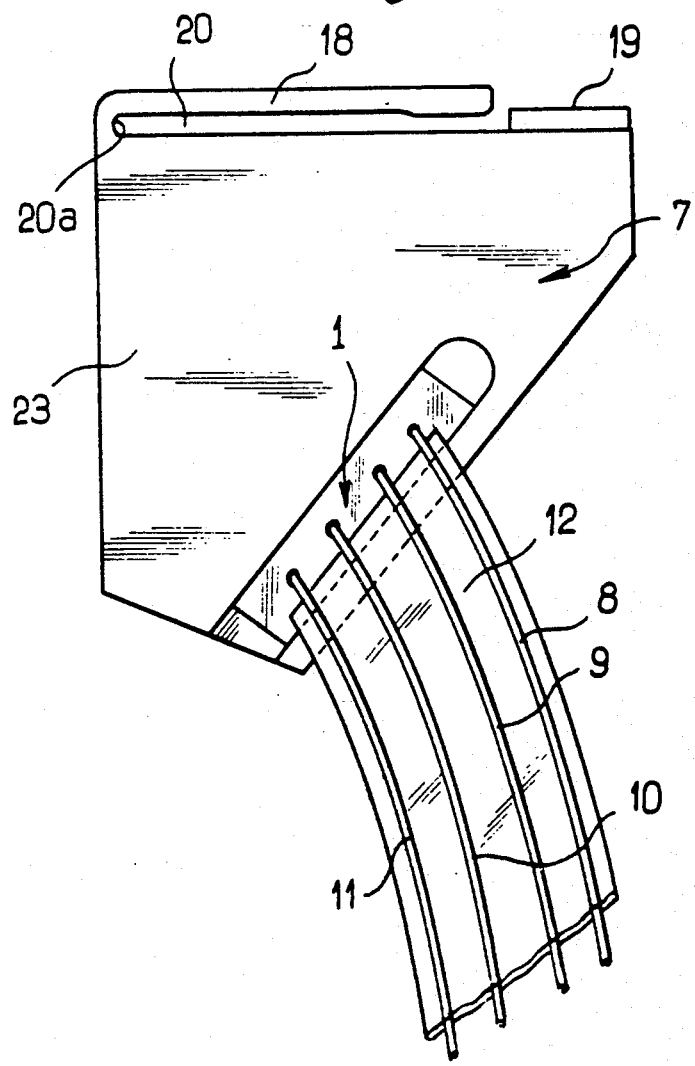
FIG_2

ELASTIC GRIPPING OPTOELECTRONIC SENSOR FOR AN ENERGY CONSUMPTION METER

FIELD OF THE INVENTION

The present invention relates to an optoelectronic sensor for domestic energy consumption meters, such as electricity meters and gas meters.

BACKGROUND OF THE INVENTION

At the present time, electricity and gas meters display on their front face a series of figures which express the consumption of electricity or gas. These figures are read periodically in order to prepare the consumption invoice. These periodic readings create serious constraints and involve a high outlay.

Many solutions have been provided for doing away with the above-mentioned readings. These solutions have involved placing inside the meter a sensor capable of detecting the passage of a reference mark on a rotary disc during each revolution of the latter.

Whenever the reference mark is detected, an electronic component associated with the sensor supplies an electrical signal. These electrical signals can be converted into electricity or gas consumption.

The reading of the consumption can thus be carried out remotely.

However, fastening these sensors inside the electricity and gas meters presents difficulties.

In fact, it is important to place these sensors at a constant and exact distance from the rotary disc carrying the reference mark, so as to obtain reliable and reproducible measurements.

The solutions provided hitherto are unsatisfactory because they entail modifications to the meters and excessive assembly times.

The object of the present invention is to overcome the disadvantages of the above-mentioned solutions.

SUMMARY OF THE INVENTION

The invention is therefore aimed at an optoelectronic sensor for a domestic energy consumption meter which comprises a rotary member of which the rotational speed is a function of the consumption, this sensor being intended to be placed inside the meter in order to detect the passage of a reference mark of the rotary member during each revolution of the latter.

According to the invention, the sensor is accommodated in a support comprising means allowing it to be fastened to an existing part inside the meter, the means maintaining the sensor at a fixed distance from the rotary member of the meter.

Thus, the mounting of the sensor is very easy and can be carried out in a very short time, since it requires no modification of the meter. The means for fastening the support can consist of a gripper capable of gripping the existing part of the meter elastically.

The support in which the sensor is accommodated makes it easier to manipulate the latter, while at the same time protecting it.

Moreover, this support, together with its quick-fastening means, guarantees a high mounting accuracy inside the meter.

According to an advantageous version of the invention, the conductors coming from the sensor are embedded in a flexible tape made of an insulating material sufficiently thin to be capable of passing between the cover of the meter and the body of the latter, without any modification of these.

According to a preferred version of the invention, the optoelectronic sensor can be fastened in an electricity consumption meter comprising, on the front face of its cover, an identification plate having an aperture, behind which a disc carrying a reference mark is mounted rotatably.

In this case, the support of the sensor preferably comprises a face equipped with an elastic tongue capable of covering the edge of the identification plate, this same face of the support having a catch which can be lodged at that end of the aperture of the identification plate adjacent to the edge of the latter covered by the tongue of the support.

Because the catch is engaged in the aperture of the identification plate, the support of the sensor is wedged in the two longitudinal directions of the aperture, on the one hand by the catch up against the end of this aperture and on the other hand by the bottom of the groove defined by the tongue which is up against the edge of the plate.

Furthermore, the catch wedges the support in the two directions of width of the aperture. Thus, the fastening of the support in relation to the aperture of the identification plate makes it possible accurately to define the distance between the sensor and the rotary disc carrying the reference mark.

The sensor according to the invention can also be fastened in a gas meter, the body of which comprises a series of graduated wheels driven in rotation, one of these carrying a reference mark.

In this case, the support of the sensor preferably comprises a face equipped with an elastic tongue capable of covering the edge of a wall extending inside the body, another face of the support having a shoulder intended for bearing against a surface of the body of the meter, in order to maintain the sensor carried by the support at a particular constant distance from the wheel carrying a reference mark.

Other particular features and advantages of the invention will also emerge from the following description.

BRIEF DESCRIPTION OF THE DRAWINGS

In the accompanying drawings given by way of non-limiting examples:

FIG. 1 is an elevation view of one face of a first version of a sensor support for an electrical consumption meter, FIG. 2 is a view of the opposite face of the support.

DETAILED DESCRIPTION OF THE INVENTION

Figure 3:
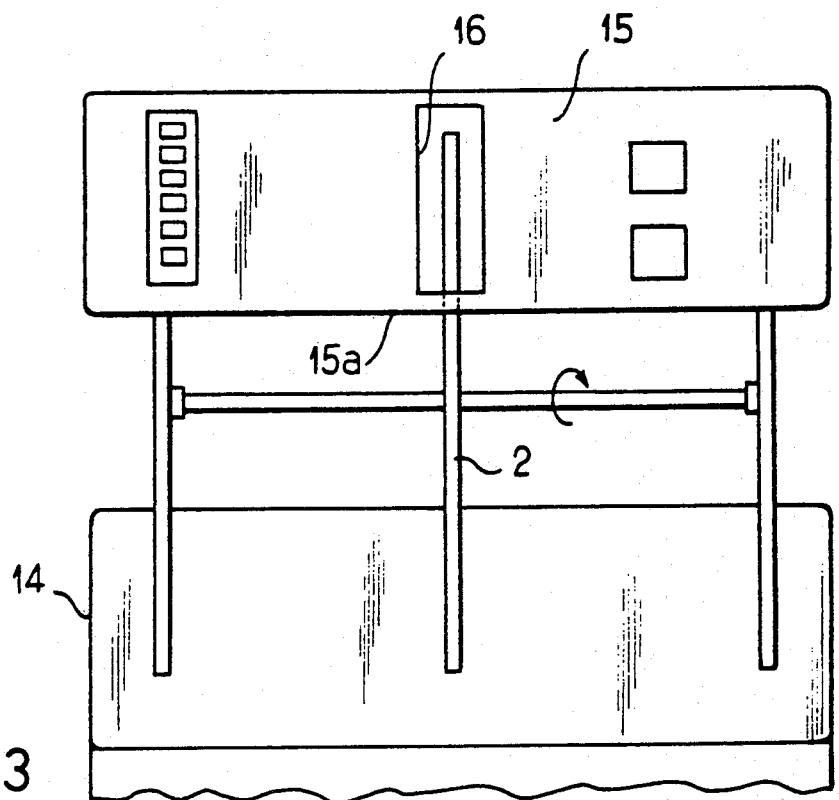
FIG. 3 is a diagrammatic perspective view of an electrical meter of which the cover has been removed.

The embodiment of FIGS. 1 and 2 show an optoelectronic sensor 1 intended to be fastened in an electricity consumption meter which comprises (see FIGS. 3 to 5) a rotary disc 2 of which the rotational speed is a function of the consumption, the sensor 1 being intended to detect the passage of a reference mark 3 of the rotary disc 2 during each revolution of the latter.

The actual sensor 1 comprises, side by side, a diode emitting infrared radiation 4, for example consisting of gallium arsenide, and a phototransistor 5, for example consisting of silicon of the n-p-n type, this diode 4 and this phototransistor 5 being mounted in a plastic body 6.

The diode 4 emits a radiation which is reflected on a reflecting surface towards to the phototransistor 5 which converts radiation received into an electrical signal. So that the radiation emitted by the diode 4 can be reflected towards to the phototransistor 5 with accuracy, the reflecting surface must be located at an exact distance from the sensor 1.

Where an electricity consumption meter is concerned, the reflecting surface consists of the rotary disc 2 which rotates at a speed proportional to the electrical power consumption.

This disc 2 from the outset carries a black reference mark 3 which is thus detected by the sensor 1 during each revolution.

According to the invention, the sensor 1 is accommodated in a support 7 made, for example, of plastic and comprising means allowing it to be fastened by elastic gripping to an existing part inside the meter, said means maintaining the sensor 1 at a fixed distance d (see FIG. 4) from the rotary disc 2 of the meter.

FIGS. 2, 4, 5 and 6 show that the conductors 8, 9, 10 and 11 coming from the sensor 1 are embedded in a flexible tape 12 made of insulating plastic sufficiently thin to be capable of passing (see FIG. 6) between the cover 13 of the meter and the body 14 of the latter, without any modification of these.

The electricity consumption meter comprises, on the front face of its cover 13, an identification plate 15 having a rectangular aperture 16, behind which (see FIGS. 3 and 5) the disc 2 carrying the black reference mark 3 is rotatably mounted.

Figure 5:
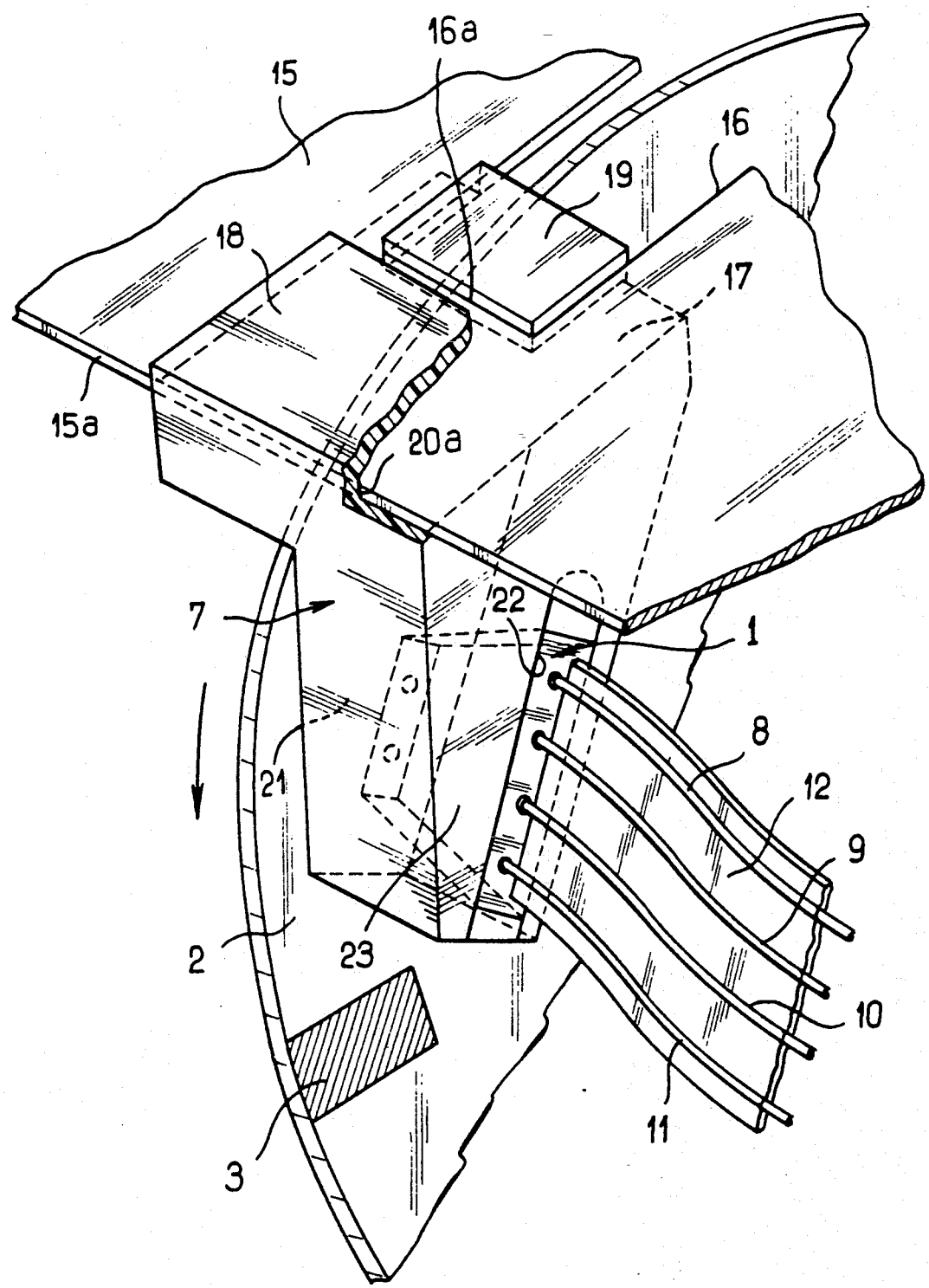
FIG. 5 is a cut-away perspective view showing the fastening of the support to the identification plate.
Figure 6:
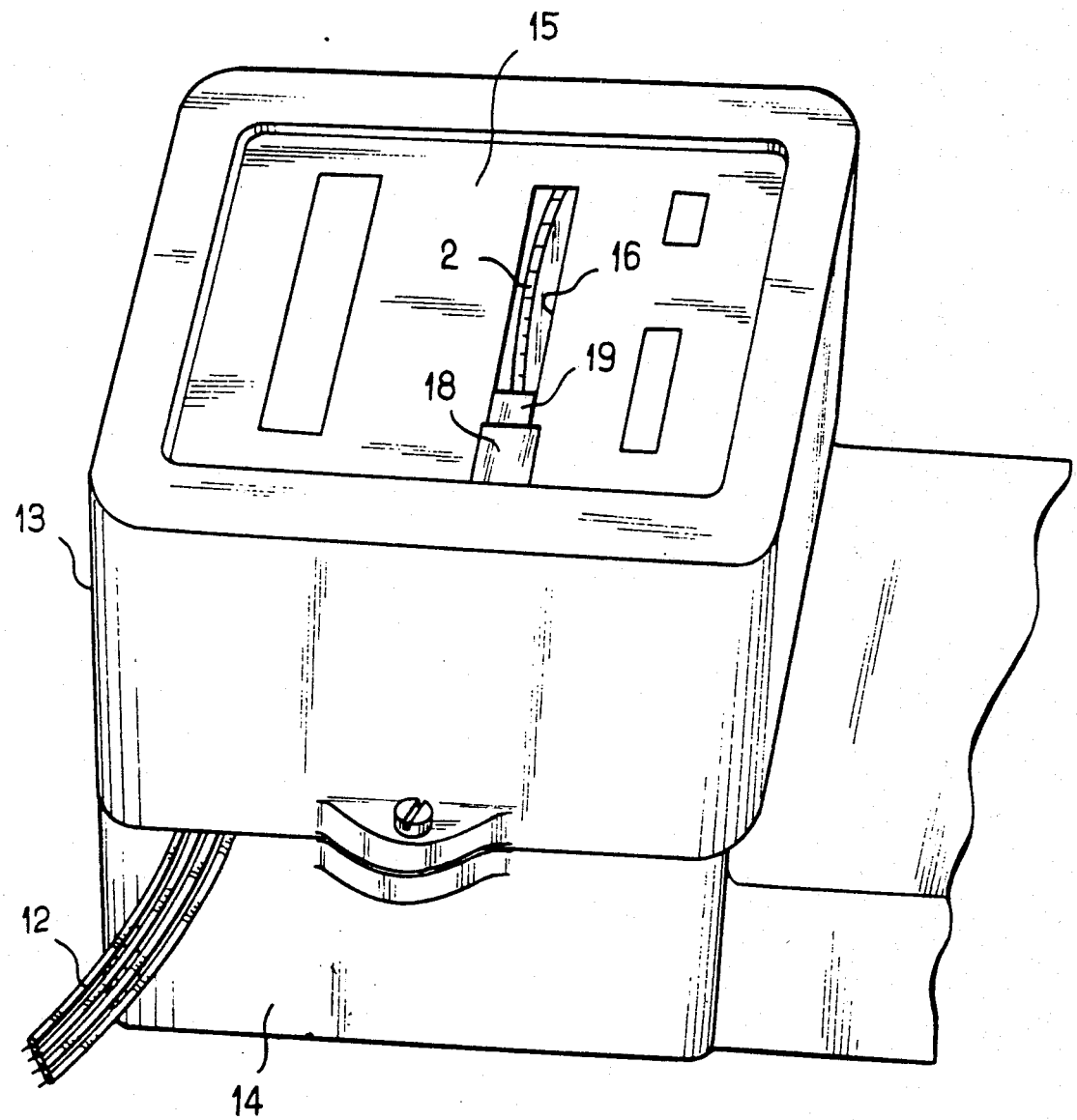
FIG. 6 is a perspective view of the meter equipped with its cover.

The support 7 of the sensor 1 comprises a face 17 equipped with an elastic tongue 18 which extends parallel to this face 17 and which is capable of covering the edge 15a of the identification plate 15, as indicated in FIG. 5. This same face 17 of the support 7 has a catch 19 which can be lodged at that end 16a of the aperture 16 of the identification plate 15 adjacent to the edge 15a of the latter covered by the tongue 18 of the support 7.

The dimensions of the catch 19 correspond to that of the end 16a of the aperture 16, so that it can fit into the latter substantially without play.

FIG. 5 also shows that the bottom 20a of the groove 20 defined between the tongue 18 and the face 17 of the support 7 is located at a distance from the catch 19 substantially equal to the distance between the edge 15a of the plate and the end 16a of the aperture of the latter. Thus, the catch 19 is wedged against the edge 16a of the aperture, and the bottom 20a of the groove 20 is wedged against the edge 15a of the plate.

Figure 4:
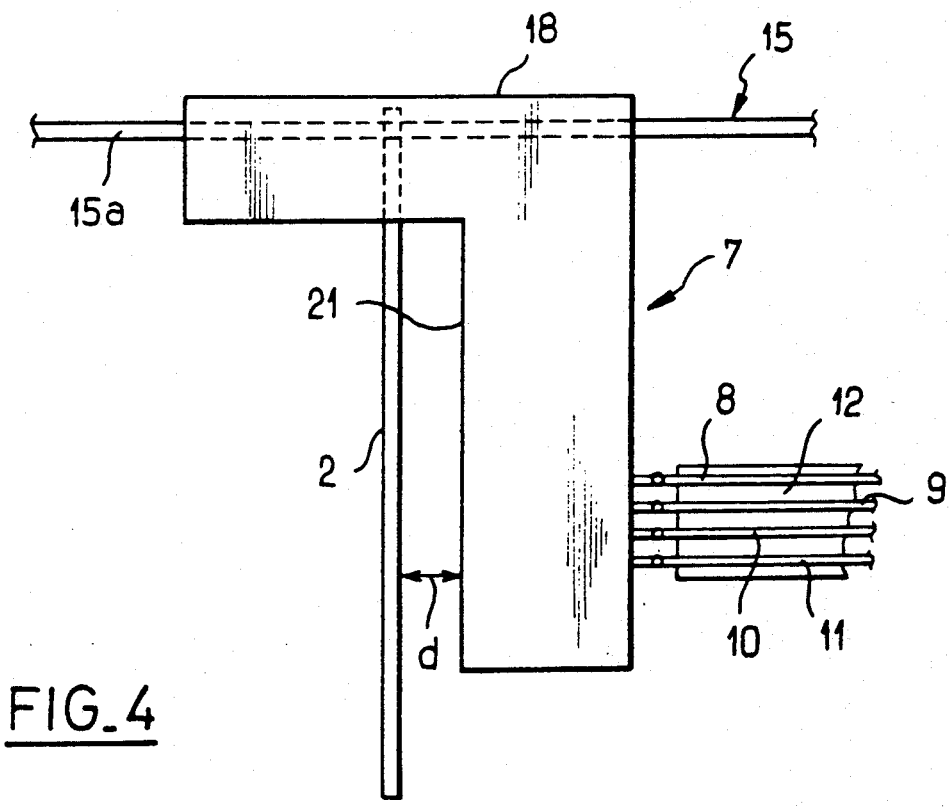
FIG. 4 is a front elevation view showing the support of the sensor in position on the edge of the identification plate and opposite the rotary disc.

Moreover, as illustrated in FIGS. 1, 4 and 5, the support 7 has a face 21 perpendicular to that having the tongue 18 and the catch 19. This face 21 possesses an orifice 22 communicating with the receptacle of the sensor 1. The distance between the catch 19 and the face 21 is determined so as to maintain the sensor 1 accommodated behind the orifice 22 at a suitable constant distance d from the disc 2 rotatably mounted in a plane parallel to the face 21. This exactly determined distance d allows the radiation emitted by the diode 4 to be reflected on the disc 2 and be received by the phototransistor 5 after reflection.

Furthermore, the support 7 has a face 23 which is opposite the said face 21 having the orifice 22 and from which emerge the conductors 8, 9, 10 and 11 connected to the sensor 1.

The mounting of the support 7 in the electricity consumption meter is extremely simple.

It is sufficient to remove the cover 13 and engage the groove 20 defined by the tongue 18 onto the edge 15a of the plate opposite the aperture 16 and then to push the support 7 towards this aperture until the catch 19 engages in the end of the aperture.

The tape 12 having the conductors 8, 9, 10 and 11 connected to the sensor 1 is subsequently passed over the edge of the body 14 of the meter, and the cover 13 is then secured.

Figure 7:
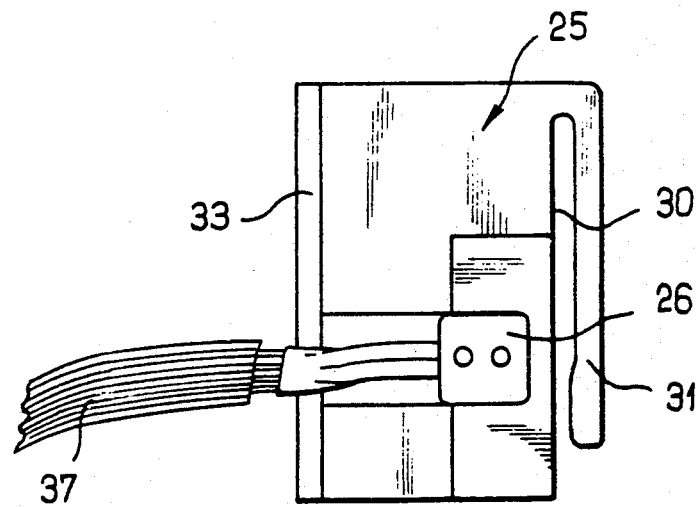
FIG. 7 is an elevation view of a sensor support intended to be fastened in a gas consumption meter.

FIG. 7 illustrates a support 25 of the sensor 26 intended to be placed in a gas consumption meter. The body 27 of this meter (see FIG. 8) comprises a series of graduated wheels 28 driven in rotation. The rotational speed of these wheels 28 is proportional to the consumption. The last wheel 28 carries a reference mark 29 consisting, for example, of a black adhesive tape and intended to be detected by the sensor 26.

The support 25 of the sensor 26 comprises a face 30 equipped with an elastic tongue 31 capable of covering and gripping the edge 32a of a wall 32 extending inside the body 27. Another face of the support 25 has a shoulder 33 intended to bear against a surface 34 of the body 27 of the meter (see FIG. 7), in order to maintain the sensor 26 carried by the support 25 at a particular constant distance $d_1$ from the wheel 28 carrying a reference mark 29.

Figure 8:
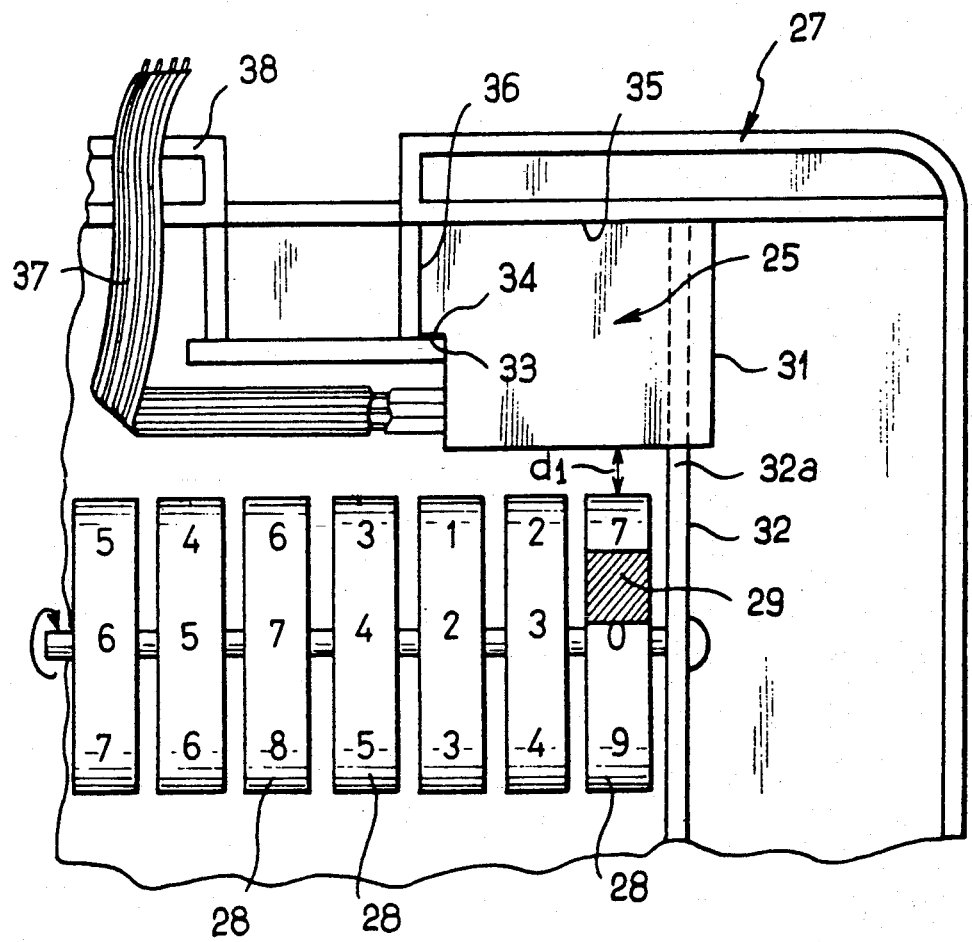
FIG. 8 is a partial plan view of a gas meter which is without its cover and in which the sensor support is fastened.

In the example illustrated in FIG. 8, the body 27 of the meter comprises, opposite the wheel 28 carrying a reference mark 29, a receptacle of a cross-section substantially in the form of a U open towards the wheel and delimited by three walls 32, 35 and 36 of the body. It can be seen from this FIG. 8 that the support 25 of the sensor has a cross-section matched to the dimensions of the receptacle, so as to be capable of fitting into the latter.

As in the embodiment according to FIGS. 1 to 6, the mounting of the support 25 in the body 27 of the gas meter is very easy and requires no modification of the meter. Likewise, the tape 37 carrying the conductors connected to the sensor 26 can be passed between the edge 38 of the body 27 of the meter and the cover (not shown) of the latter.

Of course, the invention is not limited to the exemplary embodiments just described, and many modifications can be made to these, without departing from the scope of the invention.

I claim:

1. Optoelectronic sensor for a domestic electricity consumption meter comprising a body (14), a cover (13), a rotary member (2) whose rotational speed is a function of the consumption, and an identification plate (15) located on said cover (13), said identification plate having an aperture (16) behind which the rotary member is rotatably mounted, said sensor (1) adapted to be placed inside the meter in order to detect the passage of a reference mark (3) of the rotary member during each revolution of the latter, said sensor (1) being accommodated in a support (7) comprising means (18) allowing said support to be fastened to an existing part (15) inside the meter, said means maintaining the sensor (1) at a fixed distance from the rotary member (2), said support (7) comprising a first face (17) equipped with an elastic tongue (18) capable of covering and elastically gripping an edge (15a) of the identification plate (15), said first face (17) having a catch (19) which can be lodged at an end of said aperture (16) adjacent to said edge (15a) of the identification plate covered by said tongue (18).

2. Sensor according to claim 1, wherein conductors (8, 9, 10, 11) emanating from the sensor (1) are embedded in a flexible tape (12) made of an insulating material sufficiently thin so as to be capable of passing between the cover (13) and the body (14) of the meter, without any modification of these.

3. Sensor according to claim 1, wherein the catch (19) has dimensions which correspond to those of said end of the aperture (16), so that said catch can fit into said aperture substantially without play.

4. Sensor according to claim 1, wherein a groove (20) defined between the tongue (18) and said first face (17) of the support (7) has its bottom (20a) located at a distance from the catch (19) substantially equal to the distance between the edge (15a) of the identification plate and the end of the aperture (16).

5. Sensor according to claim 2, wherein the support (7) has a second face (21) perpendicular to the first face (17) equipped with the tongue (18) and the catch (19), said second face (21) possessing an orifice (22) communicating with the sensor (1), the distance between the catch (19) and said second face (21) being determined so as to maintain the sensor (1) accommodated behind the orifice (22) at a suitable constant distance from the rotary member (2) rotatably mounted in a plane parallel to said second face (21).

6. Sensor according to claim 5, wherein the support (7) has a third face (23), which is opposite said second face (21), and from which emerge said conductors (8, 9, 10, 11) connected to the sensor (1).

* * * * *